(12) United States Patent
Verhoeven et al.

(10) Patent No.: US 6,432,560 B1
(45) Date of Patent: Aug. 13, 2002

(54) ELECTROLUMINESCENT DEVICE

(75) Inventors: Jan Willem Verhoeven, Koog aan de Zaan; Marijn Goes, Amsterdam; Johannes Willem Hofstraat, Eindhoven, all of (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/556,907

(22) Filed: Apr. 20, 2000

(30) Foreign Application Priority Data

Apr. 23, 1999 (EP) ............................................. 99201275

(51) Int. Cl.$^7$ ............................................. H05B 33/14

(52) U.S. Cl. ........................ 428/690; 428/690; 428/917; 428/704; 313/504; 313/506

(58) Field of Search ................................ 428/690, 917, 428/704; 313/504, 506

(56) References Cited

U.S. PATENT DOCUMENTS

| 5,597,890 A | * | 1/1997 | Jenekhe | 528/397 |
| 5,837,391 A | * | 11/1998 | Utsugi | 428/690 |
| 6,015,631 A | * | 1/2000 | Park | 428/690 |

FOREIGN PATENT DOCUMENTS

| EP | 0396172 A1 | 11/1990 | ......... C08F/220/34 |
| WO | WO9013148 | 11/1990 | ........... H01L/33/00 |
| WO | WO9723807 | 7/1997 | ............. C02F/1/35 |

OTHER PUBLICATIONS

Goes et al. (Eur. J. Org. Chem., 11, 1998, p2373–2377).*

* cited by examiner

Primary Examiner—Cynthia H. Kelly
Assistant Examiner—Ling Xu
(74) Attorney, Agent, or Firm—Aaron Waxler

(57) ABSTRACT

An electroluminescent device (1) comprising an active layer (7) of an organic charge-transfer compound having a donor-bridge-acceptor structure in a polymer matrix. A blue emitting EL device may be formed having a high electroluminescent intensity and increased stability.

3 Claims, 3 Drawing Sheets

(3)

(4)

(5)

ELECTROLUMINESCENT DEVICE

Figure 1:
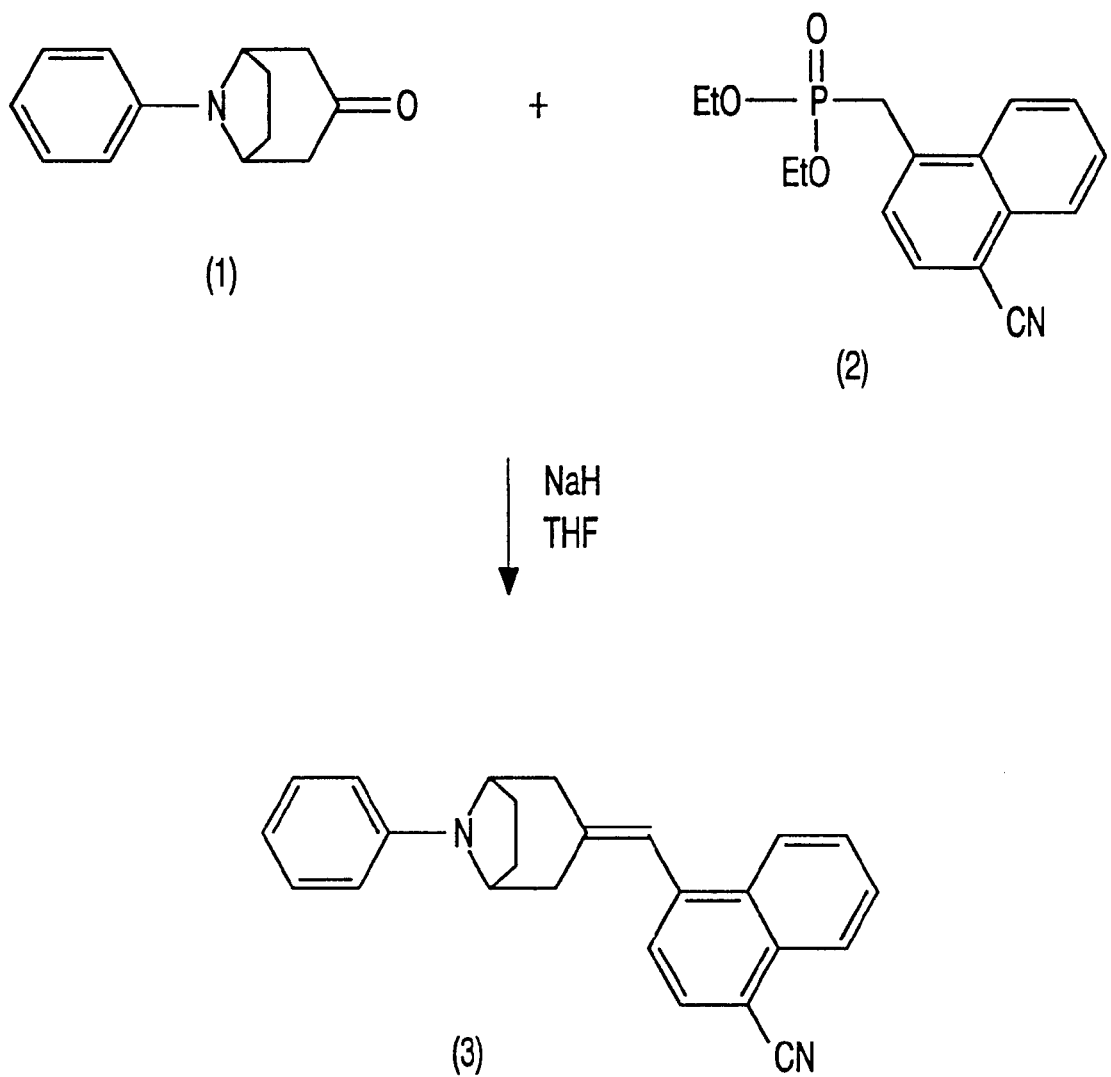

The invention relates to an electroluminescent device comprising an active layer having an electroluminescent property, which layer comprises an organic compound in a polymer matrix and which is situated between two electrode layers, at least one of said electrode layers being transparent to the light to be emitted.

The active (or electroluminescent) layer and both electrode layers can jointly form one light-emitting diode (LED), but the EL device preferably comprises various LED's, for example in the form of a matrix of light-emitting surfaces, as intended for a display. An EL device emits light when an electric field is applied across the active or emissive layer. Such a device cannot only be used as a display but also, for example, as a light source.

The use of inorganic materials such as GaAs for the active layer has been known for a long time. Since a number of years also organic materials are known, in particular semiconductive organic polymers, which can be used for the active layer.

An EL device with a semiconductive polymer for the active layer is known from the international patent application WO 90/13148. The semiconductive polymer has a conjugated polymer chain. A particularly suitable polymer is, for example, poly(p-phenylene vinylene) (PPV), in particular 2,5-substitued PPV. Said patent application discloses also a mixture of PPV and another polymer. The band gap, the electron affinity and the ionization potential can be adjusted by choosing the proper conjugated polymer chain and proper side chains. Unlike electrically conducting polymers, these conjugated polymers are undoped. In addition, such polymers enable flexible substrates to be used. The active layer of an organic polymer is situated between two electrode layers of electrically conducting materials, namely one for the injection of holes and one for the injection of electrons into the active layer. If the electrode layers are connected to a voltage source, light is emitted from the polymer layer.

It is an object of the invention to provide an EL device, which has an alternative organic compound in the active layer, which shows a high electroluminescent intensity and has an increased stability, as compared to conventional aromatic compounds, with respect to the influence of oxygen and water. Moreover, the invention makes it possible to provide a blue emitting EL device.

This object is achieved by an EL device as described in the opening paragraph, which is characterized in accordance with the invention in that the organic compound consists of charge-transfer molecules having a donor-bridge-acceptor structure. Charge-transfer (CT) molecules used in accordance with the invention consist of a donor (D) moiety and an acceptor (A) moiety separated by a bridge, which either comprise a non-conjugated (D-σ-A) or a conjugated (D-π-A) group. It was found that CT molecules in an active layer can be directly brought into the excited state by injection of holes and electrons from a contiguous anode and a cathode layer, respectively, provided that their concentration is sufficiently high to enable percolation of charge through the active layer, i.e. the percolation threshold is achieved. The residence of an injected hole and an electron on the same CT molecule is equivalent to the excited state of the molecule. This excited state relaxes by intramolecular charge recombination under the emission of light. The generation of the excited state is not necessarily due to energy transfer from the host polymer, so that directly a blue emitting species may be formed. Another advantage of the application of CT molecules is that they exhibit a large Stokes' shift, so that reabsorption and inner filter effects as well as Forster-type energy transfer are minimal. As a result, a high electroluminescent intensity can be generated.

The donor moiety comprises an electron-donating group, such as a nitrogen, oxygen, sulphur, or phosphorus atom. Examples are an amine-type structure, an aniline, a succinimidyl derivative or a diphenylcarbazole derivative. Preferably, the donor moiety comprises an aromatic moiety with an electron-donating group. The aromatic moiety is, preferably, phenyl or naphthyl, whereas the electron-donating group is, preferably, a nitrogen atom. A preferred donor moiety is the diphenylamino group.

The acceptor moiety is a preferably unsaturated or aromatic unity with or without an electron-withdrawing group. Electron-withdrawing groups are e.g. nitrile, nitro, carbonyl, halogen, cyano, sulfoxide, —$SO_2R$ (R being an alkyl having 1 to 4 carbon atoms or aryl), —$CF_3$, dicyanovinylidene, or tricyanovinylidene groups. Suitable aromatic groups are phenyl, pyrenyl, naphthyl, furanyl, and thienyl groups, which may be substituted or may contain hetero atoms (for phenyl and naphtyl groups). If unsaturated moieties contain more than one unsaturated bond, these bonds are preferably conjugated bonds.

The bridge moiety provides sufficient electronic coupling between the donor and acceptor moieties to induce significant oscillator strength to the charge recombination process. Examples of suitable bridges are conjugated unsaturated or aromatic groups (D-π-A), But also nonconjugated bonds, in which an array of sigma bonds provides sufficient through-bond electronic couping (D-σ-A). The latter example requires an array of sigma-bonds in the bridge aligned with the donor and acceptor orbitals in a continuous all-trans configuration or at least in a configuration that deviates little from such an all-trans configuration.

An example of a σ-bridge moiety is a tropane moiety (8-azabicyclo[3.2.1]octane):

Other examples are:

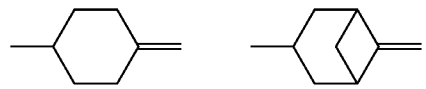

Other suitable π-bridge moieties are the following structures:

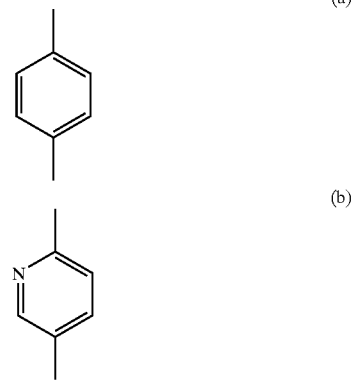

(c)
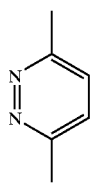

(d)
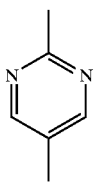

(e)
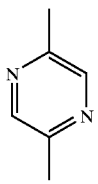

(f)
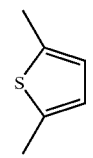

(g)
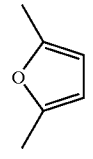

Other suitable π-bridge moieties are:

(h)
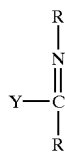

(i)
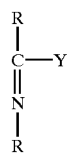

(j)

(k)
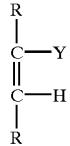

wherein Y is hydrogen, CN, or halogen, and R is independently selected from (a), (b), (c), (d), (e), (f) and (g) above.

Figure 2:
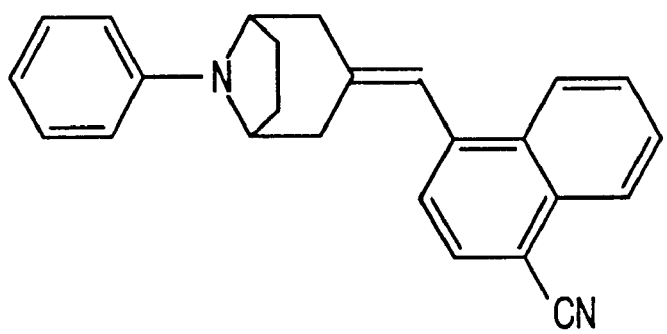
Figure 2:
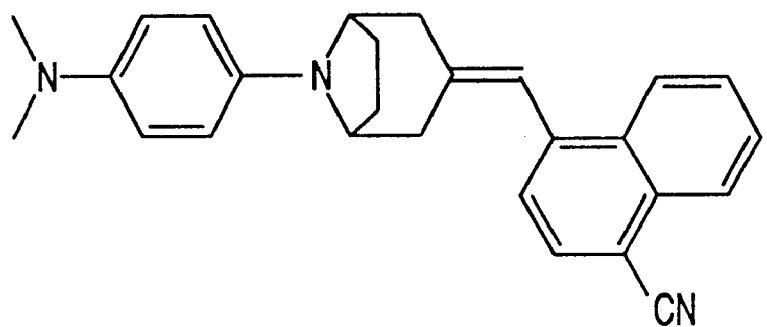
Figure 2:
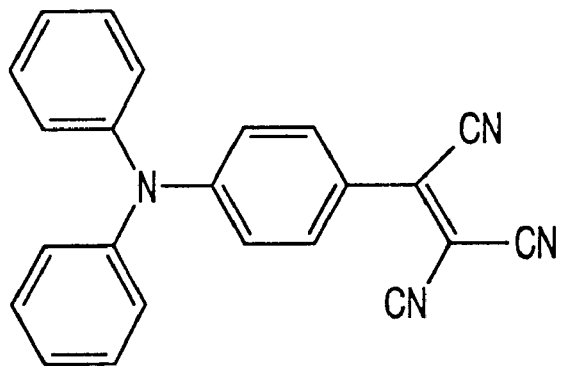

Some preferred examples of CT molecules to be used in an electroluminescent device in accordance with the invention are shown in FIG. 2:

Formula (3): N-phenyl-3-[(4-cyano-1-naphthyl)methyl]-8-azabicyclo[3.2.1]octane,

Formula (4): p-amino-N-phenyl-3-[(4-cyano-1-naphthyl)methyl]-8-azabicyclo[3.2.1]octane, both having the tropane bridge, and Formula (5): diphenylamino-p-tricyanovinylidenebenzene, having the phenyl bridge (a). Its synthesis is described in the international patent application WO-A-97/23807.

Some examples of other CT molecules, which can be used in an electroluminescent device in accordance with the invention, and which have one of the the above mentioned π-bridge moieties, are the N-donor-π-acceptor compounds disclosed in the above mentioned WO-A-97/23807. Some representatives are:

4-(diphenylamino)-4'-nitrostilbene (DPANS),
N,N-di-(2-hydroxyethyl)-tricyanovinylbenzenamine (TCVDEA),
4-tricyanovinyl-4'-[2-(hydroxymethyl)-3-hydroxypropyl]-triphenylamine (TCVDPA-1),
4-tricyanovinyl-4'-(2,3-dihydroxypropoxy)-triphenylamine (TCVDPA-2),
4,4'-dihydroxy-4"-nitrotriphenylamine (NTPA),
4,4'-dihydroxy-4"-cyanotriphenylamine.

Other CT molecules which can be used in an electroluminescent device in accordance with the invention, although less stable with respect to oxygen, are D-π-A NLO compounds having an acceptor group which is a sulphone group containing a substituent selected from the group formed by alkyl, hydroxyalkyl and alkyl(meth)acrylate, such as disclosed in the European patent application EP-A-396172, filed by Applicants.

The CT compound may be mixed with a transparent polymer in order to obtain an active layer in which the CT compound is present in a polymer matrix. These polymers may be electrically insulating, such as polystyrene, polycarbonates, polyurethanes, polyacrylates, polyimides, polyarylates, and polyethers. As these polymers are insulating, it is necessary that the concentration of the CT compound is sufficient to achieve the percolation threshold for charge transport in the active layer. It was found that 10 wt. % of a CT compound according to formula (5) in FIG. 2 was sufficient to achieve the percolation threshold, whereas 5 wt. % was not.

In semiconducting polymers, like polyvinylcarbazole, lower concentrations of a CT compound can be used, because here the polymer can act as a (hole) transport medium. The CT compound may also be mixed with EL polymers, such as the above mentioned PPV-derivatives. In such semiconducting polymers the CT compound acts as an energy trap and emits its typical color. The rapid depletion of the excited states in these polymers, which are in general more vulnerable to radical or ionic attack in view of their unsaturated structures, will result in a significant improvement in stability.

The embodiments mentioned above concern solid solutions of a CT compound in a polymer. Further improvement of the stability will be obtained when the CT molecules are covalently bonded to the polymer chain, either as a side group to the polymer main chain or by incorporation into the polymer main chain. This can be done by attaching monofunctional CT compounds to polymers with reactive groups, or by preparation of copolymers of difunctional CT compounds and difunctional monomers. If, for example, a CT compound is to be incorporated into a polycarbonate main chain, it has to be hydroxy-functionalized. If the CT compound is dihydroxy-functionalized it will react with a diisocyanate to a polyurethane, with a diol to a polyester, and with an acid chloride to a polycarbonate. If, for example, the CT compound is functionalized with a maleimide group, it can be copolymerized with (meth)acrylate or styrene monomers.

The active layer of the CT compound in a polymer matrix can be provided on a substrate from a solution of the CT compound and the polymer in a suitable solvent. For this purpose, all application methods, which are known per se, can be used. The layer is preferably provided by spin coating. The layer thickness of the active layer is governed, inter alia, by the concentration of the polymer used in the solvent and by the rotational speed during spin coating. The layer can be provided at room temperature and, apart from the evaporation of the solvent, no further thermal aftertreatment is required. By virtue thereof, many synthetic resin substrates which do not withstand high temperatures, can be used.

The layer thickness of the active layer often ranges between 50 and 200 nm, in particular between 75 and 150 nm.

The active layer is present between two electrode layers of electroconductive materials. At least one of said electrode layers should be transparent or transmit the light emitted by the active layer. One of the electrode layers serves as the electrode for the injection of holes into the active layer. The material of this electrode layer has a high work function and is formed, for example, by a thin layer of gold or silver, or preferably a layer of tin oxide or indium-tin oxide (ITO). Such layers are transparent to the light emitted by the active layer. Particularly ITO is suitable owing to the fact that it has a good electroconductivity and a high transparency. Also a layer of conductive polyaniline or poly-3,4-ethylene dioxythiophene, whether or not in combination with an ITO layer, can be used as the transparent electrode layer.

The second electrode layer serves as the electrode for the injection of electrons into the active layer. The material for this layer has a low work function and is formed by a layer, for example, of indium, aluminium, calcium, barium or magnesium. In particular when use is made of reactive barium, it is efficacious to cover this second electroconductive layer with a protective layer, for example, of epoxy or an inert metal. The electrode layers can be provided on the substrate by means of methods, which are known per se, such as vacuum evaporation, sputtering or a CVD process.

Optionally, a charge-transport layer is provided between an electrode layer and the active layer.

The layers for the EL structure are provided on a substrate which is composed, for example, of glass, quartz glass, ceramic or synthetic resin materials. Preferably use is made of a translucent or transparent substrate, for example a transparent flexible foil of a synthetic resin material. Suitable transparent synthetic resins are, for example, polyimide, polyethylene terephtalate and polytetrafluoroethylene.

Figure 3:
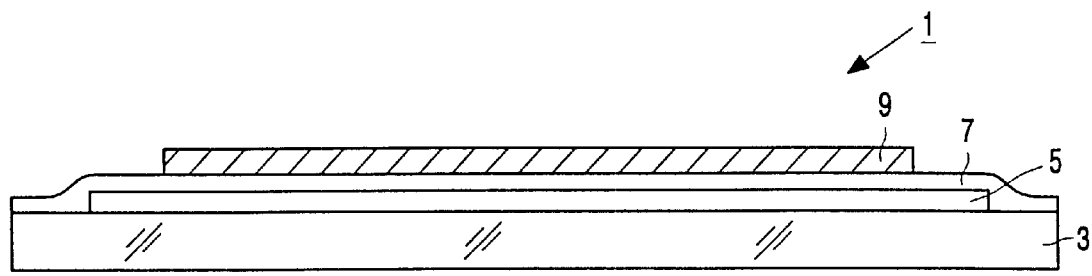
Figure 4:
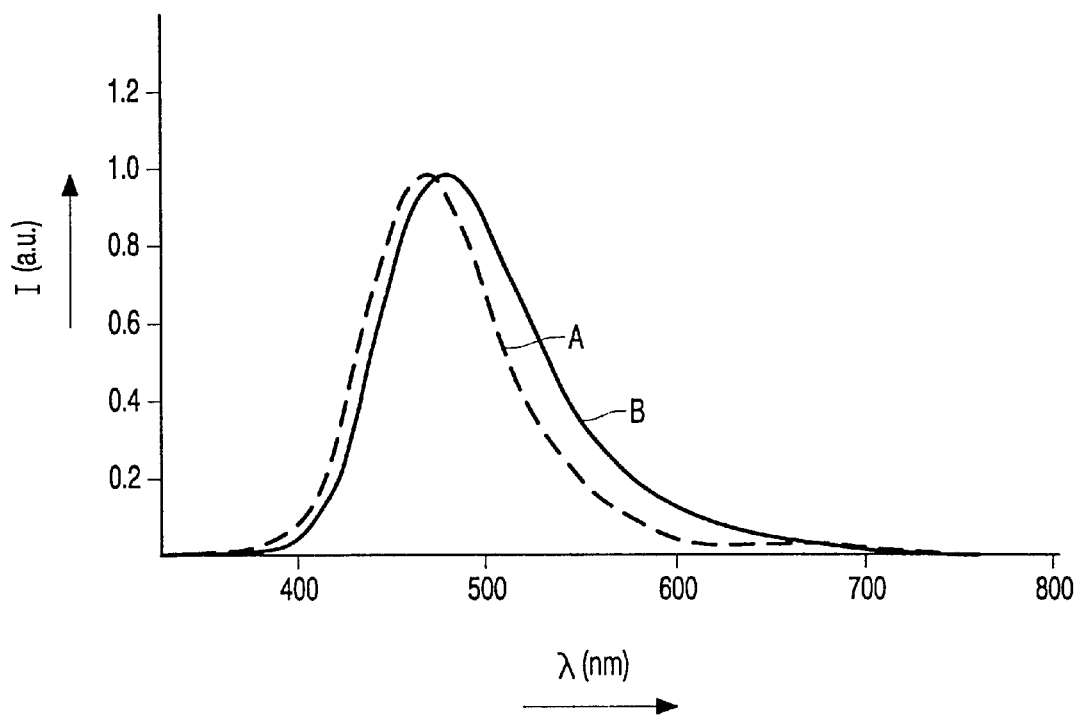

These and other aspects of the invention will be apparent from and elucidated with the aid of exemplary embodiments, and the accompanying drawings, wherein:

FIG. 1 shows the reaction scheme of the preparation of a CT compound with formula (3), FIG. 2 shows formulae of some examples of CT compounds to be used in an EL device in accordance with the invention, FIG. 3 is a schematic cross-sectional view of an EL device in accordance with the invention, and FIG. 4 shows the electroluminescence spectra of a CT compound with formula (3) in a polystyrene matrix (dashed curve A) and in a polyvinylcarbazole matrix (solid curve B).

EXEMPLARY EMBODIMENT 1

First, the synthesis of CT compound with formula (3) (see scheme in FIG. 1) will be described.

N-phenyl-8-azabicyclo[3.2]octane-3-one (N-phenyltropanone)

4.82 g (36.4 mmol) of 2,5-dimethoxytetrahydrofuran and 0.2 ml of concentrated sulphuric acid were refluxed in 30 ml $H_2O$ for half an hour. The mixture was added to a solution of 3.82 g (41 mmol) aniline, 11.0 g (75.5 mmol) acetonedicarboxylic acid and 18.0 g sodium acetate in 500 ml water. The mixture was allowed to stand overnight. The separated solid was filtered off, and dissolved in a 5% HCl solution. After cooling it was made alkaline (pH 9-10 with ammonia) and extracted with $CHCl_3$. The organic layers were dried over $Na_2SO_4$ and evaporated. This yielded a thick brown solid, which was suitable (NMR) for further synthesis. Yield: 2.75 g (13.7 mmol, 37%) of N-phenyltropanone, formula (1) in FIG. 1.

N-phenyl-3-[(4-cyano-1-naphthyl)methyl]-8-azabicyclo[3.2.1]octane (see formula (3) in 0.397 g (1.9 mmol) N-phenyltropanone (1) and 0.597 g (1.9 mmol) diethyl[(4-cyano-1-naphthyl)methyl] phosphonate (2) were dissolved in dry THF under a $N_2$ atmosphere. While cooling the mixture in an ice-bath, 0.21 g NaH (50–60% dispersion in oil) is added. The reaction mixture was stirred overnight. The brown suspension was poured into water, and extracted with $CHCl_3$. The organic layers were dried over $Na_2SO_4$ and evaporated. The product was purified by column chromatography (silica,ethyl acetate/$CH_2Cl_2$/petroleum ether 1:1:1). Recrystallization from ethanol yielded yellow needles. Yield: 0.412 g (1.18 mmol, 62%) of compound (3) in FIG. 1. Melting point 103°–104° C.

In the schematic view of FIG. 3, the dimensions, such as the layer thicknesses, are not drawn to scale. In FIG. 3, reference numeral 1 represents a part of a cross-section of an EL device in accordance with the invention. A transparent indium-tin-oxide layer (ITO) 5 having a thickness of 150 nm and a surface resistance of less than 20Ω/square is deposited by means of sputtering on a glass substrate 3. Said layer 5 serves as the electrode layer for injecting holes into the active layer 7. This active layer 7 has a thickness of 100 nm and is manufactured by spin coating a solution of CT compound (3) and polystyrene in toluene. After evaporation of the toluene, an active layer 7 is obtained which consists of 10 wt. % CT compound in a PS matrix. On top of the active layer 7 there is an aluminium electrode layer 9 for injecting electrons into the active layer 7. The electroluminescent device 1 is now ready for use. Both electrode layers 5 and 9 are connected to a direct-current source. The switch-on voltage amounts to 15 Volts. In operation, the active layer 7 emits blue light with an emission maximum at a wavelength of 475 nm.

The electroluminescent spectrum obtained for such an EL device is shown in FIG. 4 (dashed curve A). The Figure shows the emission intensity I (in arbitrary units a.u.) as a function of the wavelength λ (in nm).

When this embodiment is repeated with concentrations lower than 10 wt. % of this compound (3) in PS, e.g. 5 wt. %, no electroluminescense is observed. The percolation threshold is apparently achieved at 10 wt. % in PS, not at 5 wt. % or less.

EXEMPLARY EMBODIMENT 2

Exemplary embodiment 1 is repeated with 5 wt. % of CT compound (3) in polyvinylcarbazole (PVK) as a polymer matrix. The solvent used for the spin-coating process is 1,4-dioxane. The switch-on voltage amounts to 13 Volts. In operation, the active layer 7 emits blue light with an emission maximum at a wavelength of 490 nm. The electroluminescent spectrum obtained for such an EL device is shown in FIG. 4 (solid curve B).

As PVK is a semiconducting polymer, also concentrations lower than 5 wt. %, e.g. 2 wt. %, of CT compound (3) can be used, because the polymer can act as a hole transport medium. The percolation threshold is therefore much lower than in insulating PS.

The EL device in accordance with the invention provides an organic LED in which CT compounds are doped in a polymer matrix. The device is stable with respect to oxygen and water and shows a high electroluminescent intensity. By using special CT compounds, a blue emitting device can manufactured.

What is claimed is:
1. An electroluminescent device comprising an active layer having an electroluminescent property, which layer comprises an organic compound in a polymer matrix and which is situated between two electrode layers, at least one of said electrode layers being transparent to the light to be emitted, characterized in that the organic compound consists of charge-transfer molecules having a donor-bridge-acceptor structure, wherein the charge-transfer molecules are covalently bonded to the polymer matrix, characterized in that the bridge of the donor-bridge-acceptor structure is a tropane moiety;

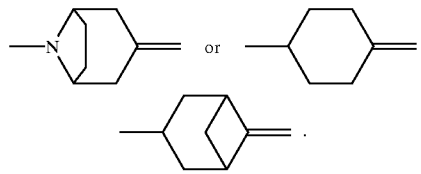

2. An electroluminescent device comprising an active layer having an electroluminescent property, which layer comprises an organic compound in a polymer matrix and which is situated between two electrode layers, at least one of said electrode layers being transparent to the light to be emitted, characterized in that the organic compound consists of charge-transfer molecules having a donor-bridge-acceptor structure, wherein the charge-transfer molecules are covalently bonded to the polymer matrix, characterized in that the polymer matrix is a semiconductive polymer, and further characterized in that the semiconductive polymer is polyvinylcarbazole.

3. An electroluminescent device comprising an active layer having an electroluminescent property, which layer comprises an organic compound in a polymer matrix and which is situated between two electrode layers, at least one of said electrode layers being transparent to the light to be emitted, characterized in that the organic compound consists of charge-transfer molecules having a donor-bridge-acceptor structure, wherein the charge-transfer molecules are covalently bonded to the polymer matrix, characterized in that the charge-transfer molecule has the formula:

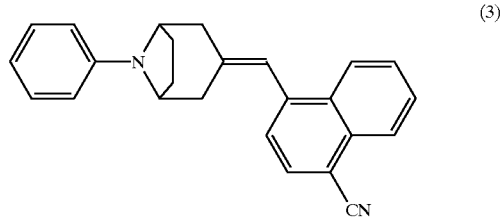

* * * * *